United States Patent
Kim et al.

(10) Patent No.: US 11,626,236 B2
(45) Date of Patent: Apr. 11, 2023

(54) STACKED INDUCTOR HAVING A DISCRETE METAL-STACK PATTERN

(71) Applicant: QUALCOMM Incorporated, San Diego, CA (US)

(72) Inventors: Jonghae Kim, San Diego, CA (US); Changhan Hobie Yun, San Diego, CA (US); Je-Hsiung Lan, San Diego, CA (US); Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 158 days.

(21) Appl. No.: 17/195,220

(22) Filed: Mar. 8, 2021

(65) Prior Publication Data

US 2022/0285080 A1    Sep. 8, 2022

(51) Int. Cl.
| | | |
|---|---|---|
| *H01F 27/28* | (2006.01) | |
| *H01F 41/04* | (2006.01) | |
| *H01L 49/02* | (2006.01) | |
| *H03H 7/01* | (2006.01) | |
| *H04B 1/18* | (2006.01) | |
| *H04B 1/40* | (2015.01) | |

(52) U.S. Cl.
CPC ....... *H01F 27/2804* (2013.01); *H01F 41/041* (2013.01); *H01L 28/10* (2013.01); *H03H 7/0138* (2013.01); *H04B 1/18* (2013.01); *H04B 1/40* (2013.01); *H01F 2027/2809* (2013.01)

(58) Field of Classification Search
CPC ............... H01F 27/2804; H01F 41/041; H01F 2027/2809; H01L 28/10; H03H 7/0138; H04B 1/18; H04B 1/40
See application file for complete search history.

(56) References Cited

U.S. PATENT DOCUMENTS

| | | | |
|---|---|---|---|
| 2011/0241163 A1 | 10/2011 | Liu et al. | |
| 2011/0248811 A1* | 10/2011 | Kireev | H01L 23/5227 336/200 |
| 2014/0110821 A1* | 4/2014 | Barry | H01L 29/86 257/E29.325 |
| 2015/0348919 A1* | 12/2015 | Sun | H01F 27/289 438/381 |
| 2018/0144857 A1 | 5/2018 | Vanukuru | |
| 2018/0323765 A1 | 11/2018 | Armanious et al. | |

FOREIGN PATENT DOCUMENTS

| | | |
|---|---|---|
| KR | 20110109956 A | 10/2011 |
| WO | 2018057351 A1 | 3/2018 |

OTHER PUBLICATIONS

International Search Report and Written Opinion—PCT/US2022/012346—ISA/EPO—dated May 11, 2022.

* cited by examiner

*Primary Examiner* — Quan Tra
(74) *Attorney, Agent, or Firm* — Qualcomm Incorporated

(57) ABSTRACT

An inductor includes a first metallization layer multi-turn trace. The inductor also includes a second metallization layer multi-turn trace coupled to the first metallization layer multi-turn trace through at least one first via. The inductor further includes a plurality of discrete third metallization layer trace segments coupled to the second metallization layer multi-turn trace through a plurality of second vias.

20 Claims, 10 Drawing Sheets

STACKED INDUCTOR HAVING A DISCRETE METAL-STACK PATTERN

BACKGROUND

Field

Aspects of the present disclosure relate to semiconductor devices and, more particularly, to a stacked inductor having a discrete metal-stack pattern.

Background

Wireless communication devices incorporate radio frequency (RF) modules that facilitate the communication and features users expect. As wireless systems become more prevalent and include more capabilities, the chips have become more complex to produce. Fifth generation (5G) new radio (NR) wireless communications devices incorporate the latest generation of electronic dies that pack many features and devices into modules that are smaller and with increasingly smaller interconnections. As these modules increase in density, inductors are important for performance and can occupy significant areas on the die.

Design challenges for mobile radio frequency (RF) chips, such as mobile RF transceivers, include analog/RF performance considerations, including mismatch, noise and other performance considerations. The design of these mobile RF transceivers includes the use of passive devices, such as inductors for example, to suppress resonance, and/or to perform filtering, bypassing, and coupling. These inductors are integrated into high power, system on chip devices, such as application processors and graphics processors.

In this example, the passive devices of a mobile RF transceiver may involve high performance inductor components. For example, analog integrated circuits use various types of passive devices, such as integrated inductors. The use of integrated inductors may consume significant area on a laminate or package substrate and may also result in higher insertion loss and lower quality (Q)-factors. It is desirable to improve key performance indicators (KPI) of integrated inductors to provide a higher Q-factor while providing improved thermal dissipation. The integrated inductors may be used for millimeter wave (mmW) filters in 5G NR RF modules.

SUMMARY

An inductor includes a first metallization layer multi-turn trace. The inductor also includes a second metallization layer multi-turn trace coupled to the first metallization layer multi-turn trace through at least one first via. The inductor further includes a plurality of discrete third metallization layer trace segments coupled to the second metallization layer multi-turn trace through a plurality of second vias.

A method for fabricating a stacked inductor having discrete metal-stack patterns is described. The method includes forming a first metallization layer multi-turn trace. The method also includes forming a second metallization layer multi-turn trace coupled to the first metallization layer multi-turn trace through at least one first via. The method further includes forming a plurality of discrete third metallization layer trace segments coupled to the second metallization layer multi-turn trace through a plurality of second vias.

A radio frequency front-end (RFFE) module is described. The RFFE module includes a semiconductor die and an integrated passive device (IPD) filter die coupled to the semiconductor die. The IPD die is composed of an inductor. The inductor includes a first metallization layer multi-turn trace. The inductor also includes a second metallization layer multi-turn trace coupled to the first metallization layer multi-turn trace through at least one first via. The inductor further includes a plurality of discrete third metallization layer trace segments coupled to the second metallization layer multi-turn trace through a plurality of second vias.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
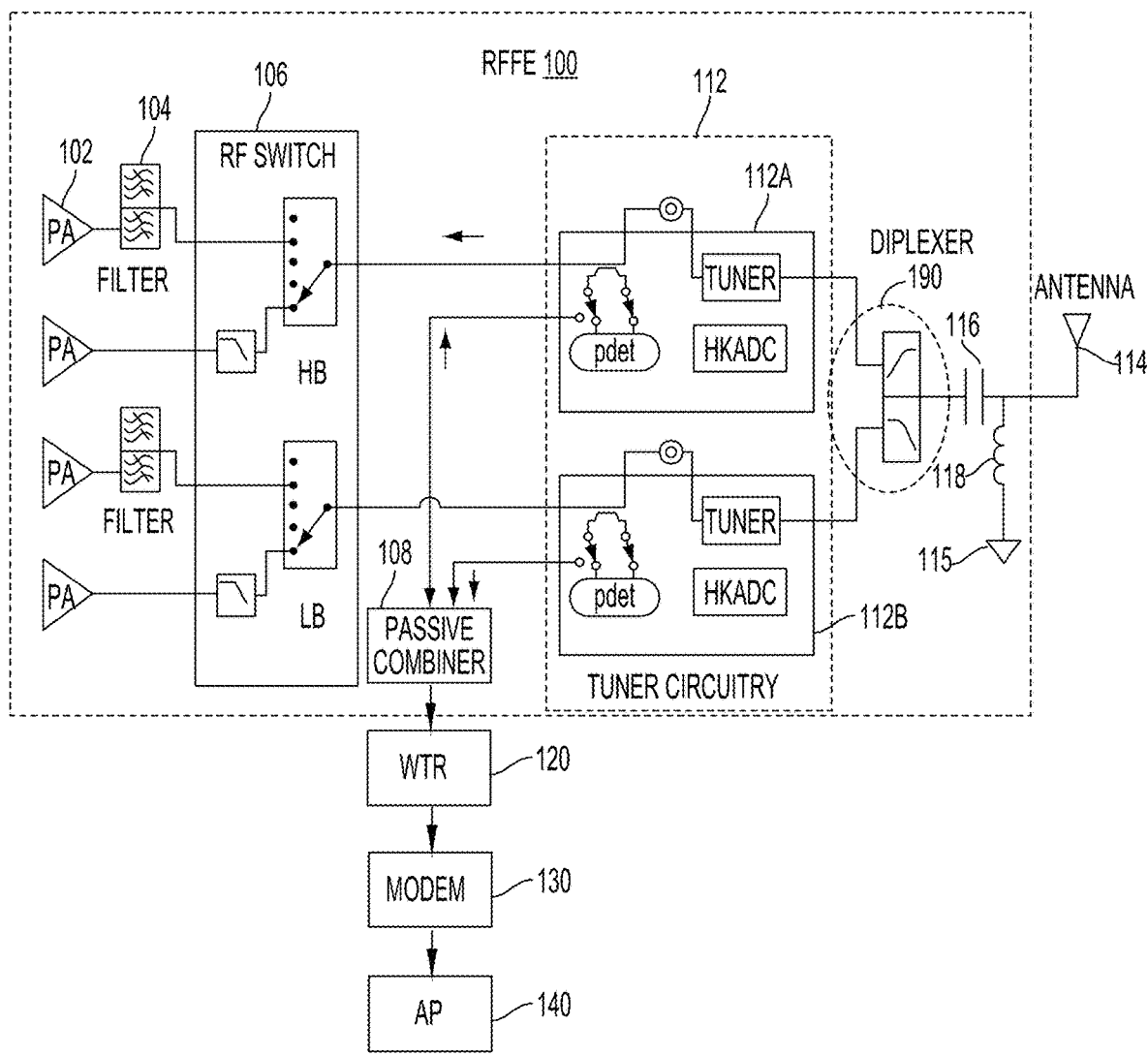
FIG. 1 is a schematic diagram of a radio frequency front-end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. Designing mobile RF transceivers is complicated by added circuit functions for supporting communication enhancements, such as fifth generation (5G) new radio (NR) communications systems. Further design challenges for mobile RF transceivers include using passive devices, which directly affect analog RF performance considerations, including mismatch, noise, and other performance considerations.

Passive devices in mobile radio frequency (RF) transceivers may include high performance inductor components. For example, analog integrated circuits use various types of passive devices, such as integrated inductors. An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at millimeter wave (mmW) frequencies (e.g., frequency range two (FR2)).

A radio frequency front-end (RFFE) module may include a 5G broadband FR2 filter including capacitors and inductors. Unfortunately, integrated inductors within the 5G broadband FR2 filter may suffer from a degraded quality (Q)-factor. In addition, the integrated inductors may cause thermal dissipation issues within the 5G broadband FR2 filter. During operation of the 5G NR broadband FR2 filter, power dissipation is related to the Q-factor of the inductors. In addition, thermal dissipation is related to both the Q-factor of the inductors as well as electro-migration (EM) of the inductors. While the inductors may be formed with a stack of back-end-of-line (BEOL) metallization layers, an inductance value is reduced as the stack increases.

Various aspects of the present disclosure provide stacked inductors having discrete metal-stack patterns. The process flow for fabrication of the stacked inductors having discrete metal-stack patterns may include front-end-of-line (FEOL) processes, middle-of-line (MOL) processes, and back-end-of-line (BEOL) processes. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. Similarly, the terms "chip" and "die" may be used interchangeably.

As described, the back-end-of-line (BEOL) interconnect layers may refer to the conductive interconnect layers (e.g., a first interconnect layer (M1) or metal one M1, metal two (M2), metal three (M3), metal four (M4), etc.) for electrically coupling to front-end-of-line (FEOL) active devices of an integrated circuit. The various BEOL interconnect layers are formed at corresponding BEOL interconnect layers, in which lower BEOL interconnect layers use thinner metal layers relative to upper BEOL interconnect levels. The BEOL interconnect layers may electrically couple to middle-of-line (MOL) interconnect layers, for example, to connect M1 to an oxide diffusion (OD) layer of an integrated circuit. The MOL interconnect layer may include a zero interconnect layer (M0) for connecting M1 to an active device layer of an integrated circuit. A BEOL first via (V2) may connect M2 to M3 or others of the BEOL interconnect layers.

According to aspects of the present disclosure, a radio frequency front-end (RFFE) module includes filters configured with stacked inductors having discrete metal-stack patterns. Aspects of the present disclosure improve key performance indicators (KPIs) of inductors within broadband filters by implementing an improved metal-stack pattern to provide a special design for 5G NR broadband FR2 filters. The special design improves inductor metal layers by providing a novel inductor metal-stack pattern. This special design may reconfigure a metal thickness in current crowding areas of the broadband filter. In some aspects of the present disclosure, this special design may add more metal layers at thermal hot-spots of the broadband filter. Some aspects of the present disclosure provide customized metal-stack patterns to provide a desired on-inductance of an inductor. These customized metal-stack patterns beneficially improve the broadband filter's electrical performance while improving thermal mitigation.

FIG. 1 is a schematic diagram of a radio frequency front-end (RFFE) module 100 employing passive devices including an inductor 118 (e.g., a stacked inductor having discrete metal-stack patterns). The RFFE module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RFFE module 100.

The radio frequency front-end (RFFE) module 100 also includes tuner circuitry 112 (e.g., first tuner circuitry 112A and second tuner circuitry 112B), the diplexer 190, the capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a housekeeping analog to digital converter (HKADC). The tuner circuitry 112 may perform impedance tuning (e.g., a voltage standing wave ratio (VSWR) optimization) for the antenna 114. The RFFE module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 190 is between the tuner component of the tuner circuitry 112 and the capacitor 116, the inductor 118 (e.g., a stacked inductor having a discrete metal-stack pattern), and the antenna 114. The diplexer 190 may be placed between the antenna 114 and the tuner circuitry 112 to provide high system performance from the radio frequency front-end (RFFE) module 100 to a chipset including the wireless transceiver 120, the modem 130, and the application processor 140. The diplexer 190 also performs frequency domain multiplexing on both high band frequencies and low band frequencies. After the diplexer 190 performs its frequency multiplexing functions on the input signals, the output of the diplexer 190 is fed to an optional inductor/capacitor (LC) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
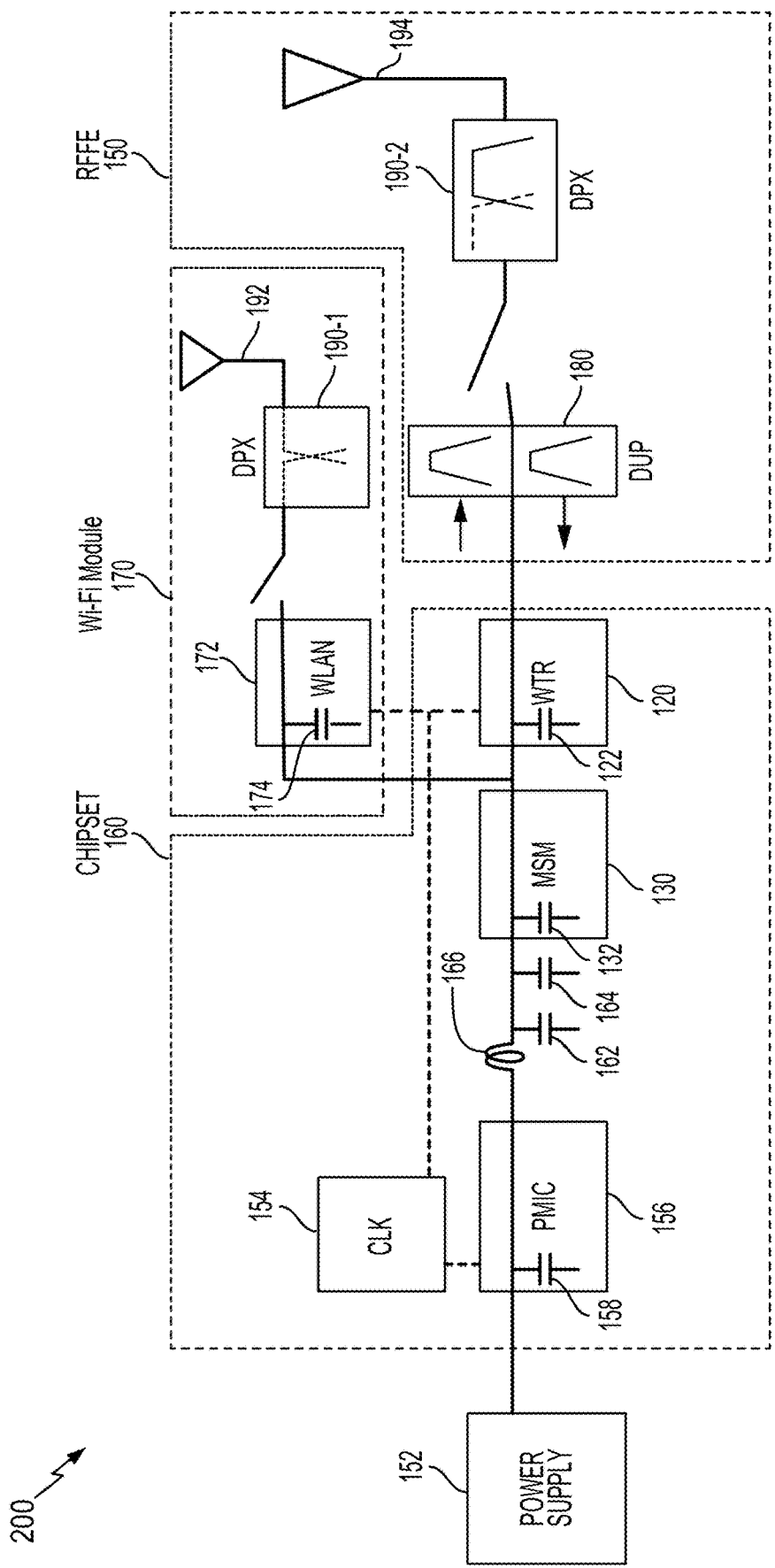
FIG. 2 is a schematic diagram of a radio frequency front-end (RFFE) module employing passive devices for a chipset.

FIG. 2 is a schematic diagram of a radio frequency integrated circuit (RFIC) chip 200, having a wireless local area network (WLAN) (e.g., Wi-Fi) module 170 including a first diplexer 190-1 and a radio frequency front-end (RFFE) module 150 including a second diplexer 190-2 for a chipset 160), including stacked inductors having discrete metal-stack patterns. The Wi-Fi module 170 includes the first diplexer 190-1 communicably coupling an antenna 192 to a wireless local area network module (e.g., WLAN module 172). The RFFE module 150 includes the second diplexer 190-2 communicably coupling an antenna 194 to a wireless transceiver (WTR) 120 through a duplexer 180. The wireless transceiver 120 and the WLAN module 172 of the Wi-Fi module 170 are coupled to a modem (mobile station modem (MSM), e.g., baseband modem) 130 that is powered by a power supply 152 through a power management integrated circuit (PMIC) 156. The chipset 160 also includes capacitors 162 and 164, as well as an inductor(s) 166 to provide signal integrity.

The power management integrated circuit (PMIC) 156, the modem 130, the wireless transceiver 120, and the wireless local area network (WLAN) module 172 each include capacitors (e.g., 158, 132, 122, and 174) and operate according to a clock 154. In addition, the inductor 166 couples the modem 130 to the PMIC 156. The design of the radio frequency integrated circuit (RFIC) chip 200 includes stacked inductors having discrete metal-stack patterns, according to aspects of the present disclosure.

Figure 3:
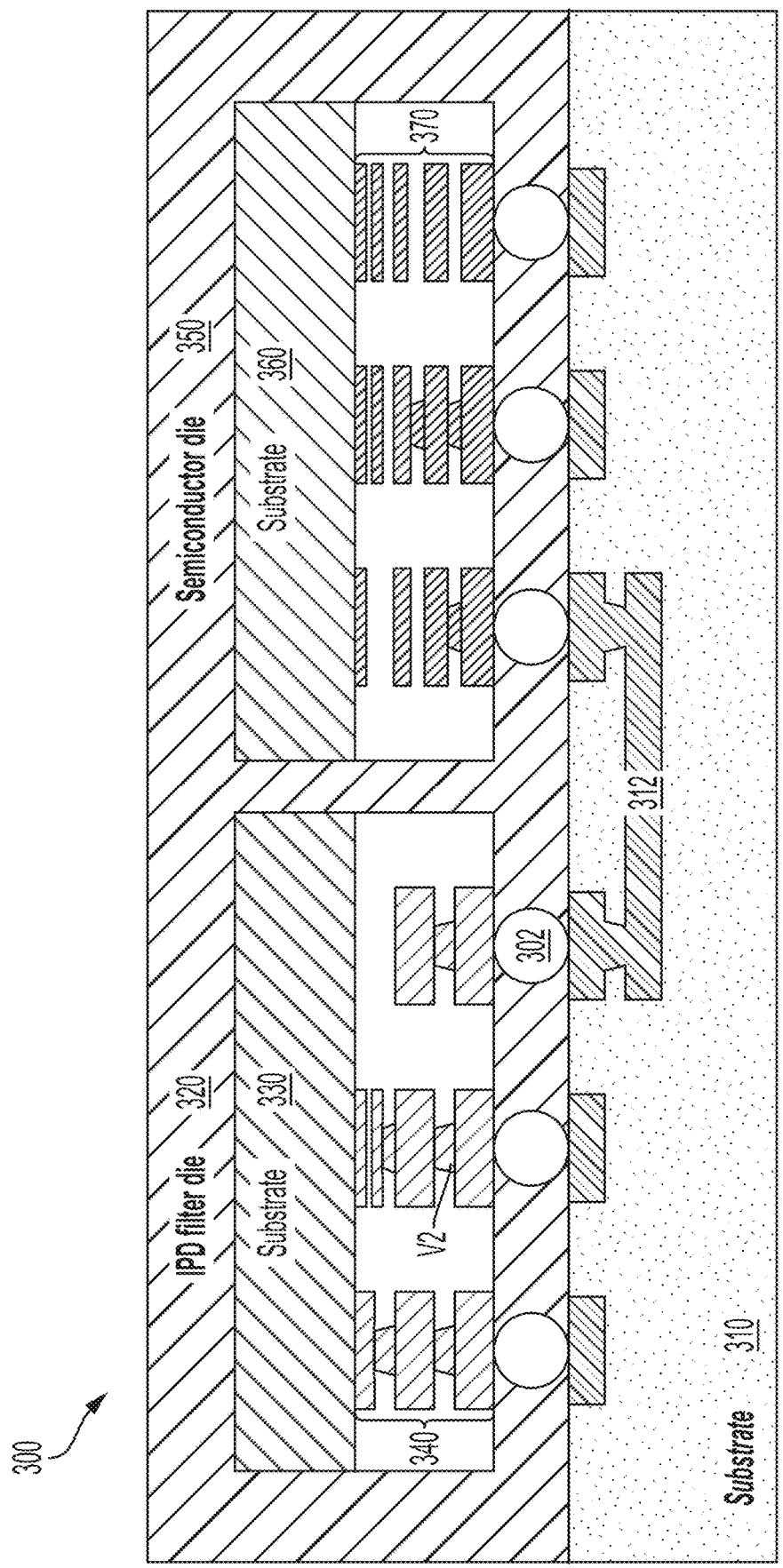
FIG. 3 is a block diagram illustrating a cross-sectional view of a radio frequency front-end (RFFE) module including a semiconductor die and an integrated passive device (IPD) filter die, in accordance with aspects of the present disclosure.

FIG. 3 is a block diagram illustrating a cross-sectional view of a radio frequency front-end (RFFE) module 300 including a semiconductor die and an integrated passive device (IPD) filter die, in accordance with aspects of the present disclosure. In this example, the RFFE module 300 includes a semiconductor die 350 and an integrated passive device (IPD) filter die 320 supported by a substrate 310. The semiconductor die 350 may be an active die having a semiconductor substrate 360 (e.g., an active silicon substrate) coupled to package balls 302 through back-end-of-line (BEOL) layers 370. The BEOL layer 370 includes multiple BEOL metallization layers (M1, M2, M3, Mn) on the semiconductor substrate 360 (e.g., a diced silicon wafer). A redistribution layer 312 is coupled to the package balls 302.

The IPD filter die 320 includes a substrate 330 (e.g., a passive substrate) coupled to the package balls 302 through back-end-of-line (BEOL) layers 340. The redistribution layer 312 is coupled to the IPD filter die 320 through the package balls 302. In some aspects, the substrate 330 is composed of glass, and the IPD filter die 320 is a glass-substrate integrated passive device (GIPD) filter die. The IPD filter die 320 may implement a 5G NR broadband FR2 filter. According to aspects of the present disclosure, the IPD filter die 320 includes stacked inductors having discrete metal-stack patterns, as shown in FIGS. 4A and 4B.

Figure 4A:
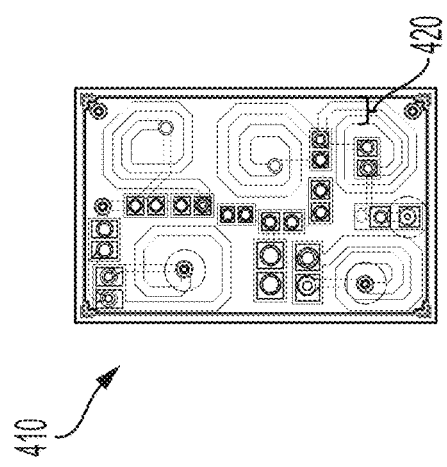
FIGS. 4A and 4B are block diagrams illustrating a top view and a perspective view of a stacked inductor having discrete metal-stack patterns, in accordance with aspects of the present disclosure.
Figure 4B:
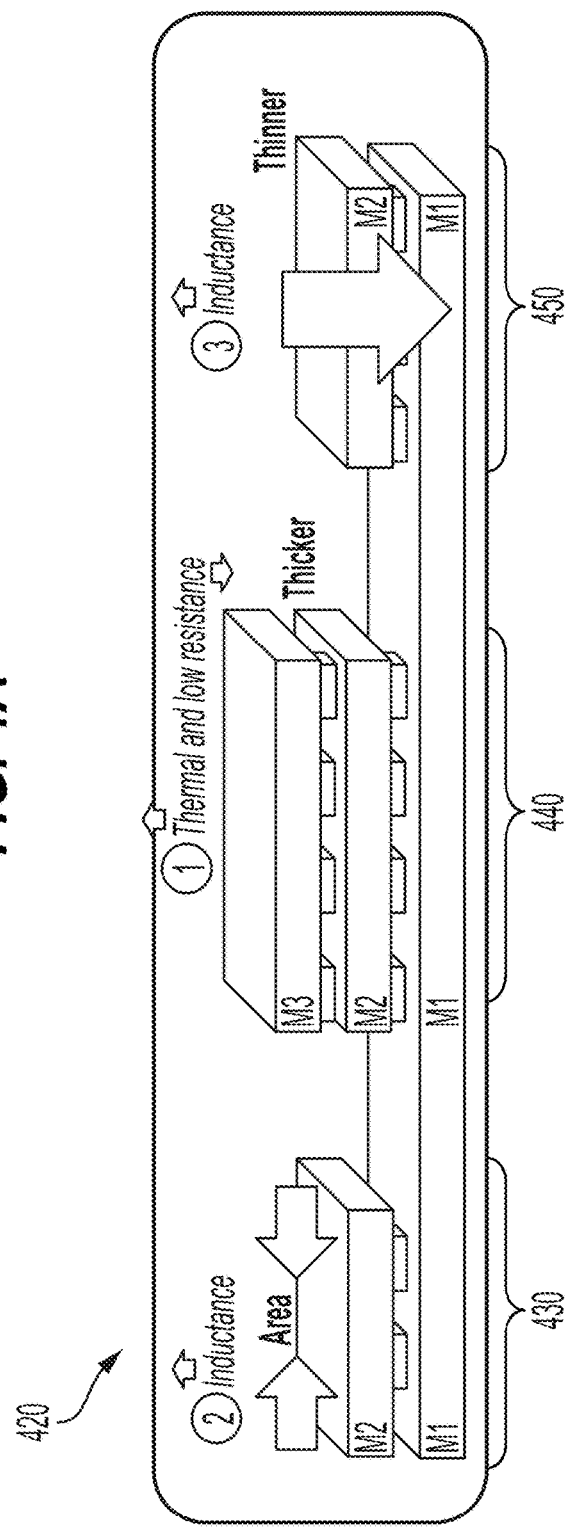

FIGS. 4A and 4B are block diagrams illustrating an top view and a perspective view of a stacked inductor having a discrete metal-stack pattern within a broadband filter, according to aspects of the present disclosure. As shown in FIG. 4A, a broadband filter 410 may be the IPD filter die 320 of FIG. 3, such as a radio frequency (RF) filter and/or a radio frequency (RF) module. FIG. 4B illustrates a perspective view of a stacked inductor 420 having varying discrete metal-stack patterns, in accordance with aspects of the present disclosure. For example, the stacked inductor 420 includes a first discrete metal-stack pattern 430, a second discrete metal-stack pattern 440, and a third discrete metal-stack pattern 450 of a multi-layer inductor.

In this example, the first discrete metal-stack pattern 430 and the third discrete metal-stack pattern 450 are composed of M1 and M2 metallization layers. In addition, the second discrete metal-stack pattern 440 is composed of M1, M2, and M3 metallization layers. An increased thickness of the second discrete metal-stack pattern 440 may reduce an inductance while increasing a quality (Q)-factor of the stacked inductor 420. The improved Q-factor provided by the second discrete metal-stack pattern 440 also improves a thermal dissipation handling capability, while reducing a resistance of the second discrete metal-stack pattern 440. By contrast, the first discrete metal-stack pattern 430 and the third discrete metal-stack pattern 450 have an increased inductance relative to the second discrete metal-stack pattern 440. The inductance of the first discrete metal-stack pattern 430 is less than the inductance of the third discrete metal-stack pattern 450 due to a smaller area of the first discrete metal-stack pattern 430.

In aspects of the present disclosure, the stacked inductor 420 is configured with one or more of the discrete metal-stack patterns of FIG. 4B depending on desired features of the stacked inductor 420. For example, additional, discrete metal-stack layers may be provided at thermal hot-spots of the broadband filter 410 using the second discrete metal-stack pattern 440. In addition, a metal thickness of the stacked inductor 420 may be adjusted in crowded areas of the broadband filter 410 using the third discrete metal-stack pattern 450. Similarly, the layers of the stacked inductor 420 may be adjusted, such as reducing an area of the layers using the first discrete metal-stack pattern 430. The discrete metal-stack patterns of FIG. 4B enable improvement of the electrical performance and thermal mitigation of the broadband filter 410 of FIG. 4A.

Figure 5:
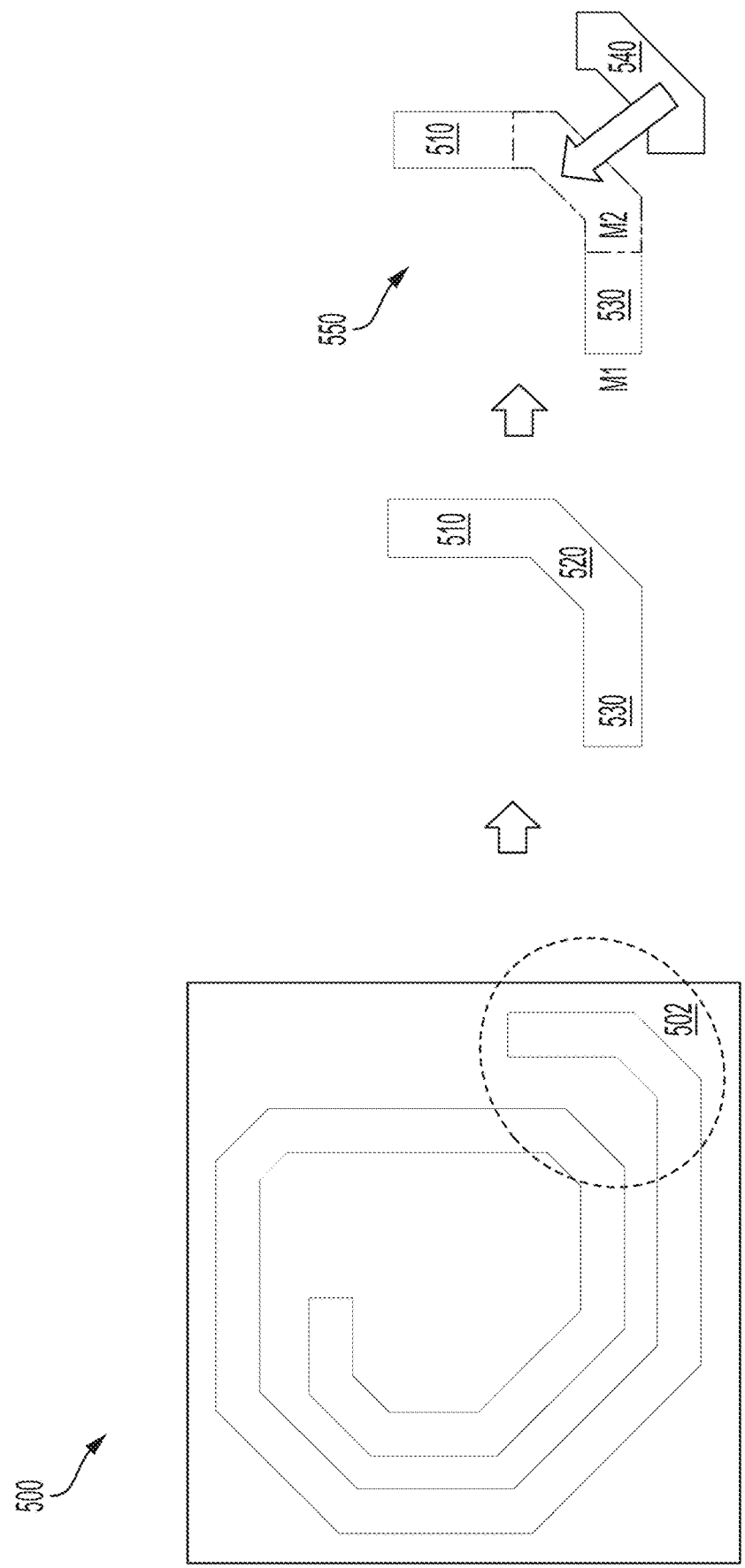
FIG. 5 is a diagram illustrating an overhead view of a stacked inductor having a discrete metal-stack pattern, according to aspects of the present disclosure.

FIG. 5 is a diagram illustrating an overhead view of a stacked inductor having a discrete metal-stack pattern, according to aspects of the present disclosure. A stacked inductor 500 shown in FIG. 5 is similar to the stacked inductor 420 shown in FIGS. 4A and 4B. In this example, the stacked inductor 500 is composed of a multi-turn trace including line-trace segments and angled joint trace segments. The angled joint trace segments are shown with a forty-five degree (45°) angle. Although the multi-turn trace of the stacked inductor 500 is composed of an M1 metallization layer, the multi-turn trace of the stacked inductor 500 may be composed of an M2 metallization layer stacked on the M1 metallization layer, as shown in FIG. 4B.

In this aspect of the present disclosure, a corner portion 502 of the stacked inductor 500 is selected for formation of a discrete metal-stack pattern. In this example, the corner portion 502 of the stacked inductor 500 includes an angled joint trace segment and line-trace segments of the stacked inductor 500. The corner portion 502 is composed of a first angled joint trace segment 520 between a first line-trace segment 510 and a third line-trace segment 530 of the stacked inductor 500. In this example, the first angled joint trace segment 520 is also shown with a forty-five degree joint and composed of the M1 metallization layer. In this aspect of the present disclosure, a second angled joint trace segment 540 is formed from the M2 metallization layer and stacked on the first angled joint trace segment 520 to form a discrete metal-stack pattern 550.

Figure 6A:
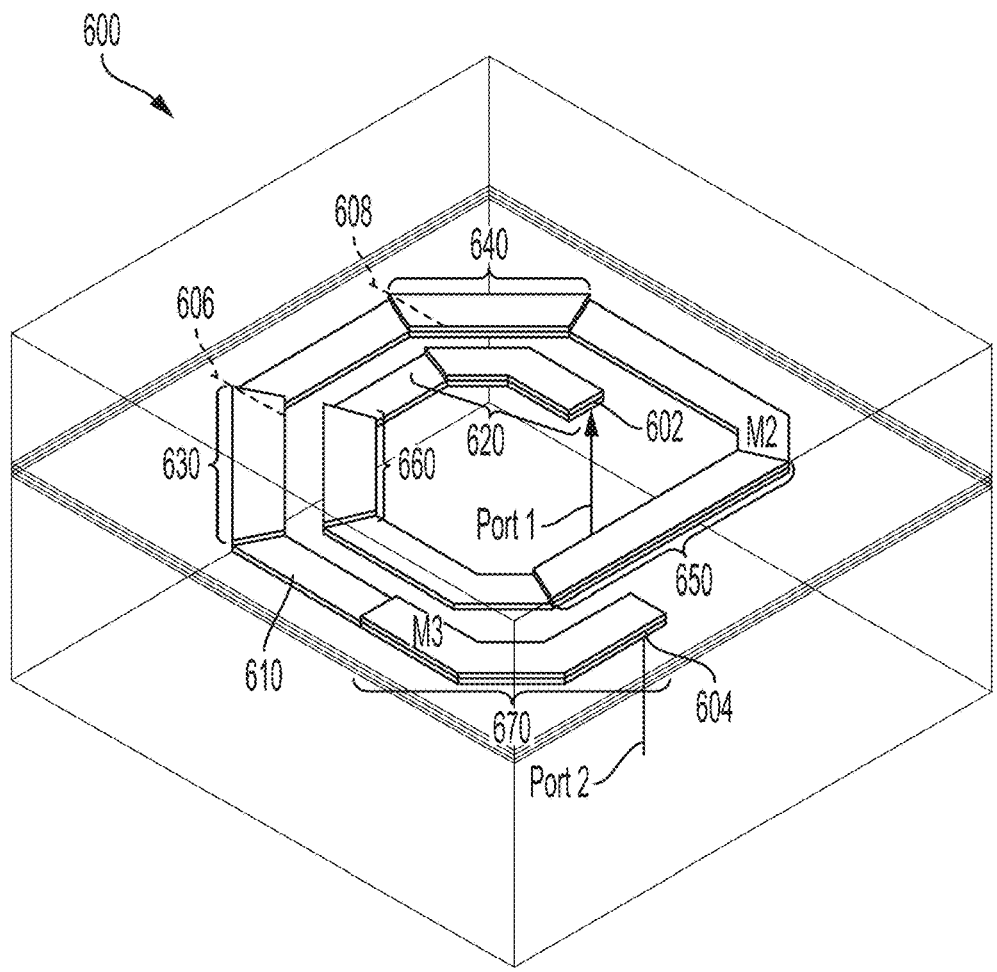
FIGS. 6A and 6B are perspective and cross-sectional views illustrating a stacked inductor having a discrete metal-stack pattern, according to aspects of the present disclosure.
Figure 6B:
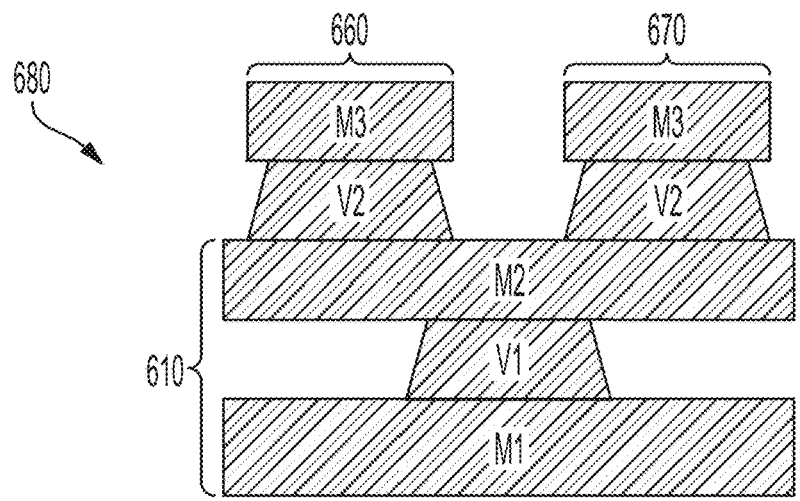

FIGS. 6A and 6B are perspective and cross-sectional views illustrating a stacked inductor 600 having a discrete metal-stack pattern, according to aspects of the present disclosure. The stacked inductor 600 shown in FIG. 6A is similar to the stacked inductor 500 shown in FIG. 5, including discrete metal-stack patterns. In this aspect of the present disclosure, the stacked inductor 600 includes a stacked, multi-turn trace 610 composed of an M2 metallization layer stacked on an M1 metallization layer including discrete metal-stack patterns formed at predetermined portions. Although shown as including the M2 metallization layer stacked on the M1 metallization layer, the stacked, multi-turn trace 610 may be composed of a single metallization layer, as shown in FIG. 4B.

In this example, a first angled trace segment 630 of an M3 metallization layer is formed on the stacked, multi-turn trace 610 proximate a first port 602. Similarly, a second angled joint trace segment 670 of the M3 metallization layer is formed on the stacked, multi-turn trace 610 proximate a second port 604 of the stacked inductor 600. The stacked inductor 600 also includes a first angled trace segment 630, a second angled trace segment 640, and a third angled trace segment 660 of the M3 metallization layer formed on the stacked, multi-turn trace 610. The stacked inductor 600 further includes a line-trace segment 650 of the M3 metallization layer formed on the stacked, multi-turn trace 610. A cross-sectional view along cut-lines 606 and 608 is shown in FIG. 6B.

FIG. 6B is a cross-sectional view illustrating the stacked inductor 600 having a discrete metal-stack pattern, according to aspects of the present disclosure. In this example, a cross-sectional view 680 of the stacked inductor 600 illustrates portions of the first angled trace segment 630 and the second angled trace segment 640 along cut-lines 606 and 608 of FIG. 6A. In this configuration, the first angled trace segment 630 and the second angled trace segment 640 are coupled to the stacked, multi-turn trace 610 through vias V2. In addition, the stacked, multi-turn trace 610 is composed of an M2 metallization layer stacked on an M1 metallization layer and coupled though a via V1.

Figure 7A:
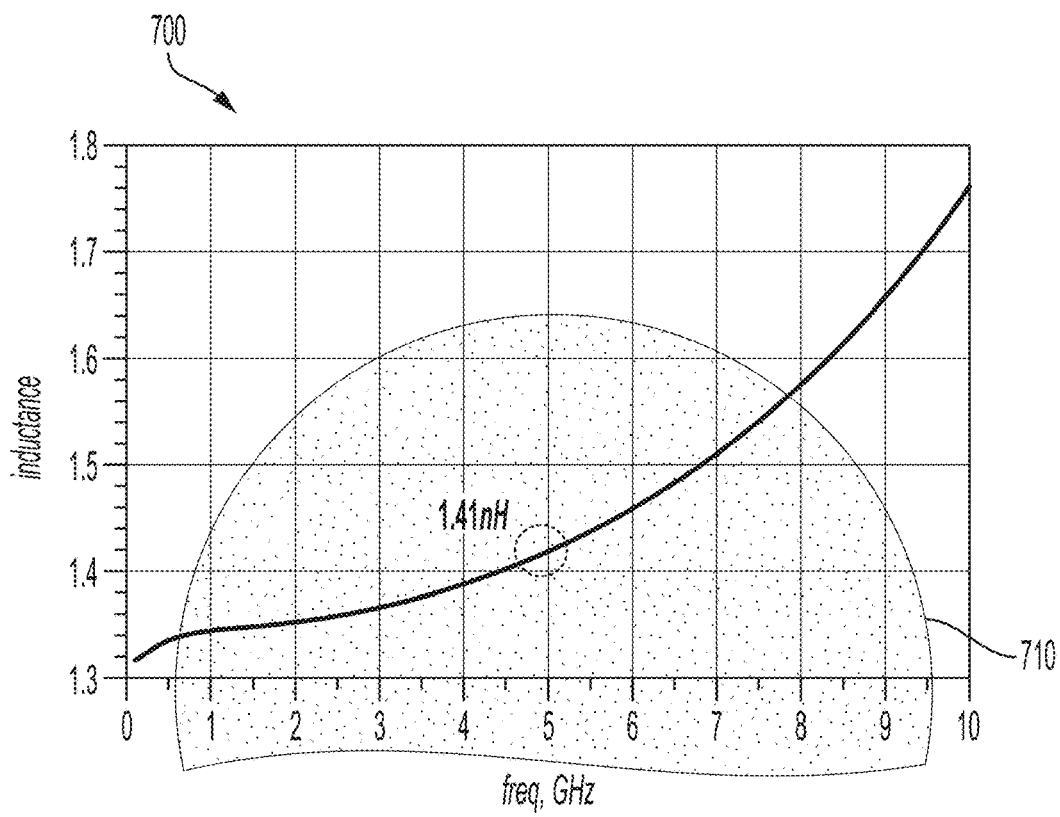
FIGS. 7A and 7B illustrate an inductance versus frequency graph and a quality factor versus frequency graph of the stacked inductor having the discrete metal-stack pattern of FIG. 6A, according to aspects of the present disclosure.
Figure 7B:
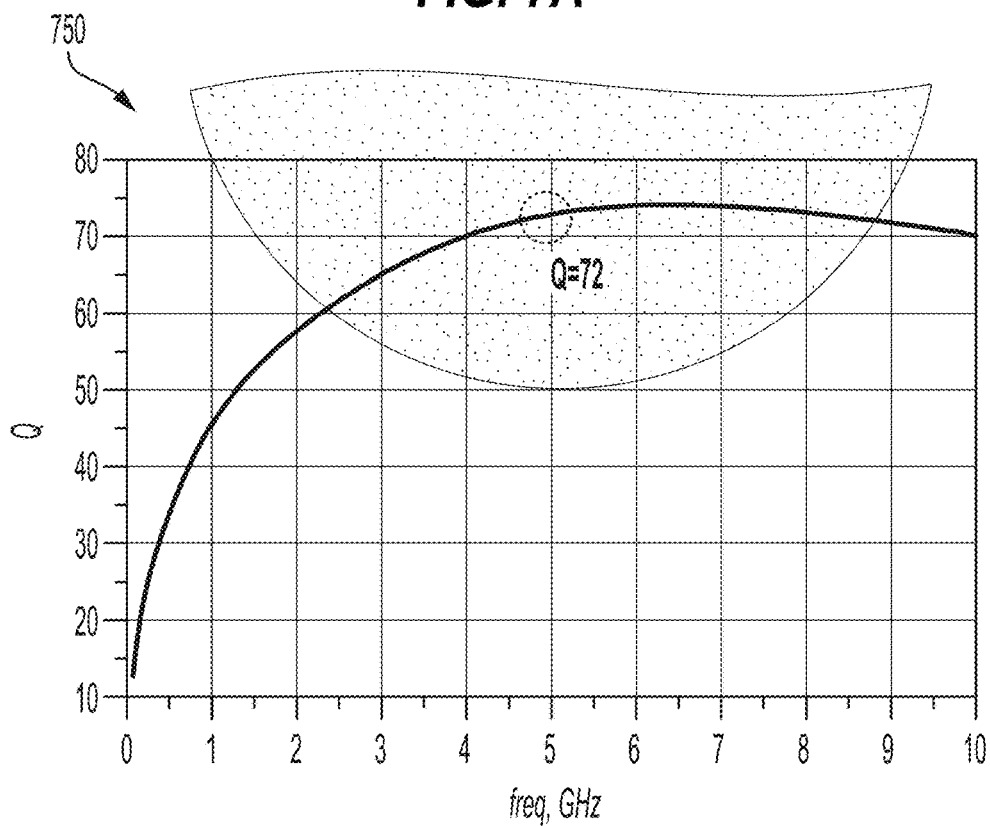
Figure 8:
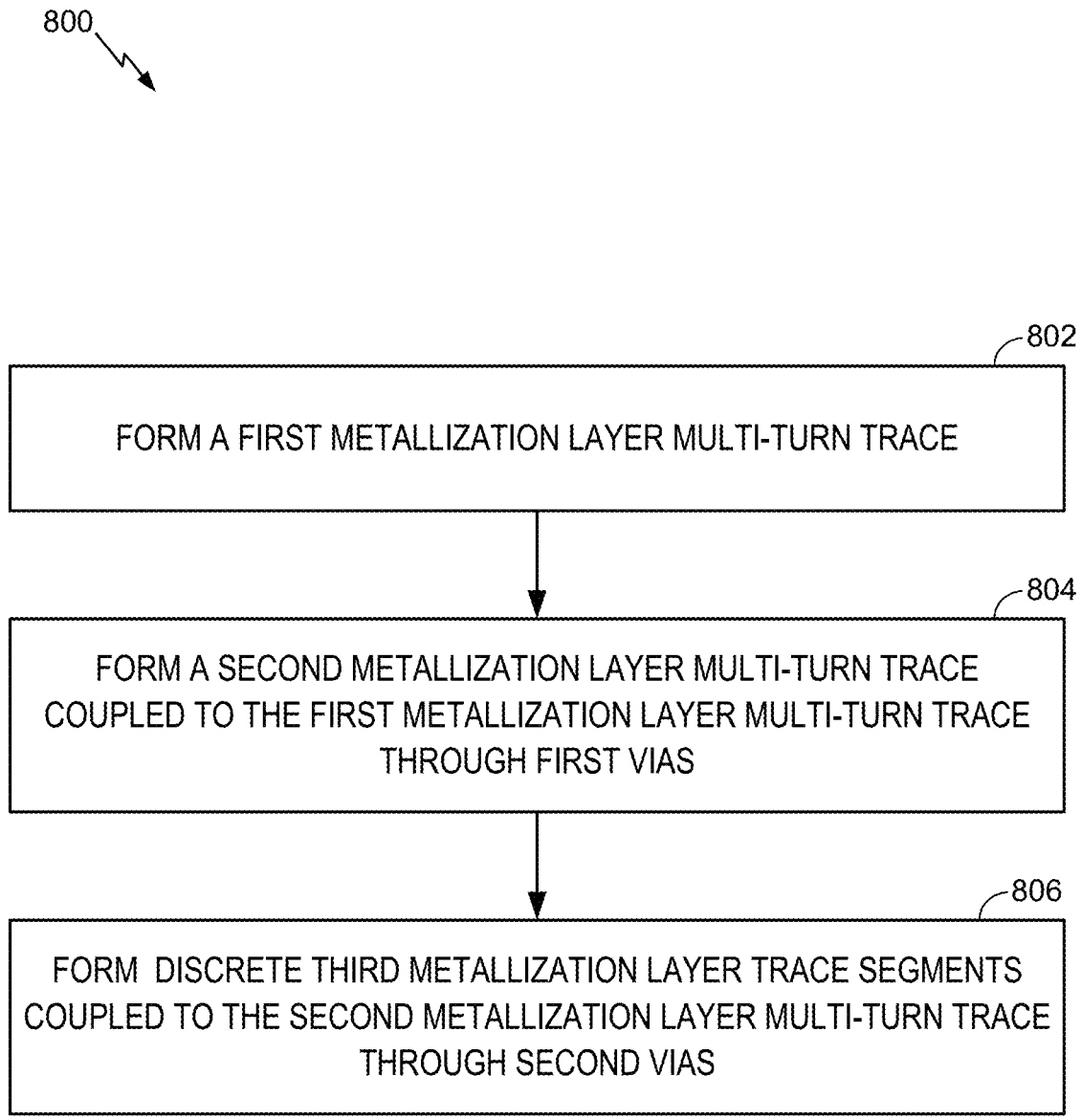
FIG. 8 is a process flow diagram illustrating a method for fabricating of a stacked inductor having discrete metal-stack patterns, according to aspects of the present disclosure.

FIGS. 7A and 7B illustrate an inductance versus frequency graph and a quality factor versus frequency graph of the stacked inductor having the discrete metal-stack pattern of FIG. 6A, according to aspects of the present disclosure. FIG. 7A illustrates an inductance versus frequency graph 700, which shows a target inductance of 1.41 nano-henry (nH). FIG. 7B illustrates a quality (Q)-factor versus frequency graph 750, which shows a target Q-factor of 72. The target inductance and the target Q-factor are shown within a highlighted area 710 for the stacked inductor 600 having the discrete metal-stack pattern of FIG. 6A, according to aspects of the present disclosure FIG. 8 is a process flow diagram illustrating a method for fabricating of a stacked inductor having discrete metal-stack patterns, according to an aspect of the present disclosure. A method 800 begins in block 802, in which a first metallization layer multi-turn trace is formed. For example, as shown in FIG. 6A, the stacked inductor 600 includes a stacked, multi-turn trace 610 composed of the M2 metallization layer stacked on the M1 metallization layer including discrete metal-stack patterns formed at predetermined portions. In block 804, a second metallization layer multi-turn trace is formed to couple to the first metallization layer multi-turn trace through first vias. For example, as shown in FIG. 6B, the stacked, multi-turn trace 610 is composed of an M2 metallization layer stacked on an M1 metallization layer and coupled though a via V1.

In block 806, discrete third metallization layer trace segments are formed to couple to the second metallization layer multi-turn trace through second vias. For example, as shown in FIG. 6B, an angled joint trace segment 620 of the M3 metallization layer is formed on the stacked, multi-turn trace 610 proximate the first port 602. Similarly, a second angled joint trace segment 670 of the M3 metallization layer is formed on the stacked, multi-turn trace 610 proximate the second port 604 of the stacked inductor 600. The stacked inductor 600 also includes a first angled trace segment 630, a second angled trace segment 640, and a third angled trace segment 660 of the M3 metallization layer formed on the stacked, multi-turn trace 610. The stacked inductor 600 further includes a line-trace segment 650 of the M3 metallization layer formed on the stacked, multi-turn trace 610. The discrete third metallization layer trace segments follow a shape of the second metallization layer multi-turn trace according to a predetermined pattern.

Aspects of the present disclosure improve key performance indicators (KPIs) of inductors within broadband filters by implementing an improved metal-stack pattern to provide a special design for 5G NR broadband FR2 filters. The special design improves inductor metal layers by providing a novel inductor metal-stack pattern. This special design may reconfigure a metal thickness in current crowding areas of the broadband filter. In some aspects, this special design may add more metal layers at thermal hot-spots (e.g., up to 100° C.) of the broadband filter. Some aspects of the present disclosure provide customized metal-stack patterns to provide a desired on-inductance of an inductor. These customized metal-stack patterns beneficially improve the broadband filter's electrical performance (e.g., insertion-loss and rejection) while improving thermal mitigation. The customized metal-stack patterns also improve the chemical-mechanical polishing (CMP) ratio for a thick copper (Cu)-layer process.

Figure 9:
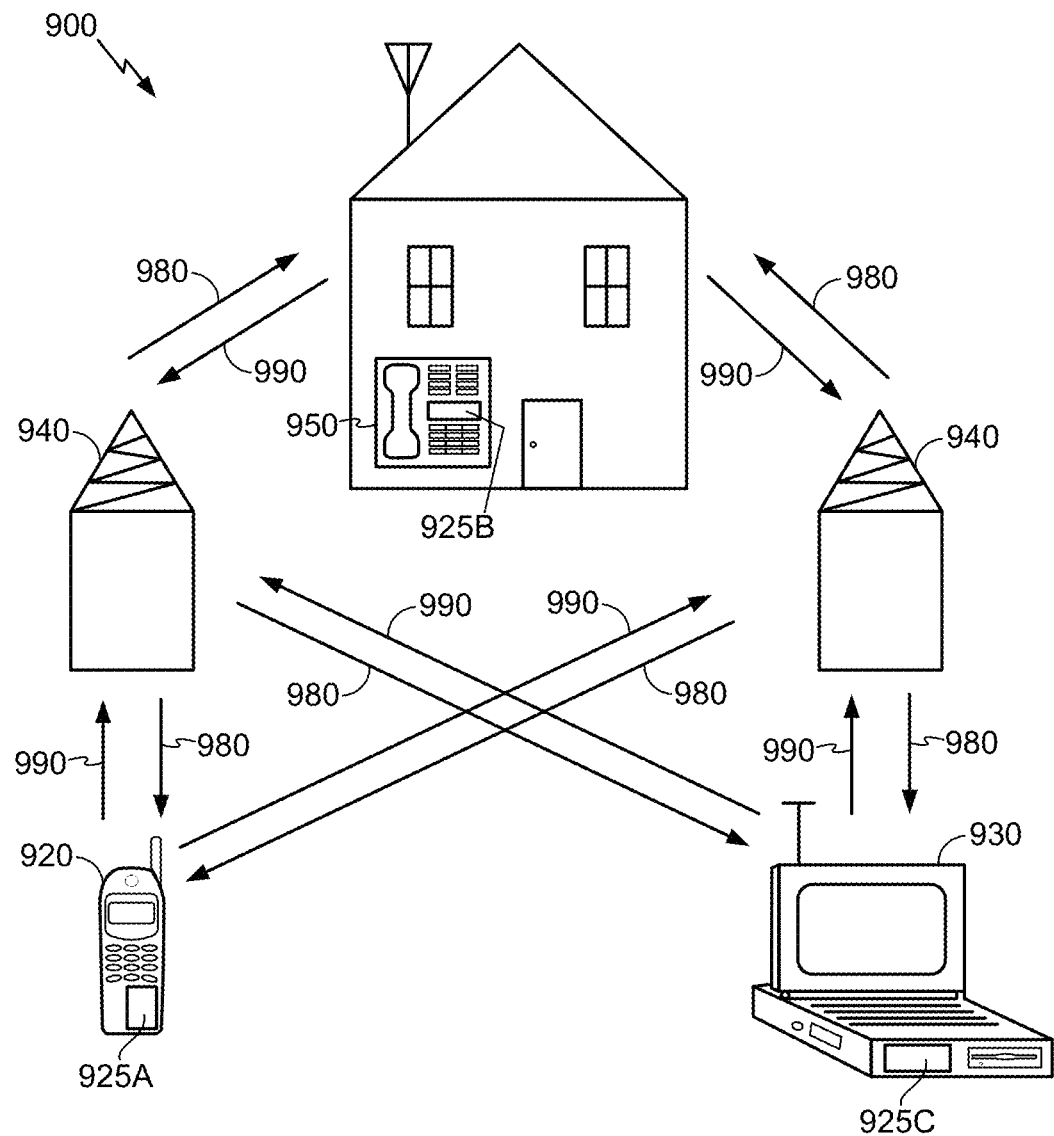
FIG. 9 is a block diagram showing an exemplary wireless communications system in which a configuration of the present disclosure may be advantageously employed.

FIG. 9 is a block diagram showing an exemplary wireless communications system 900 in which an aspect of the disclosure may be advantageously employed. For purposes of illustration, FIG. 9 shows three remote units 920, 930, and 950 and two base stations 940. It will be recognized that wireless communications systems may have many more remote units and base stations. Remote units 920, 930, and 950 include integrated circuit (IC) devices 925A, 925C, and 925B that include the disclosed stacked inductor having discrete metal-stack patterns. It will be recognized that other devices may also include the disclosed stacked inductor s, such as the base stations, switching devices, and network equipment. FIG. 9 shows forward link signals 980 from the base station 940 to the remote units 920, 930, and 950, and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 9 illustrates remote units according to the aspects of the present disclosure, the present disclosure is not limited to these exemplary illustrated units. Aspects of the present disclosure may be suitably employed in many devices, which include the disclosed stacked inductors.

Figure 10:
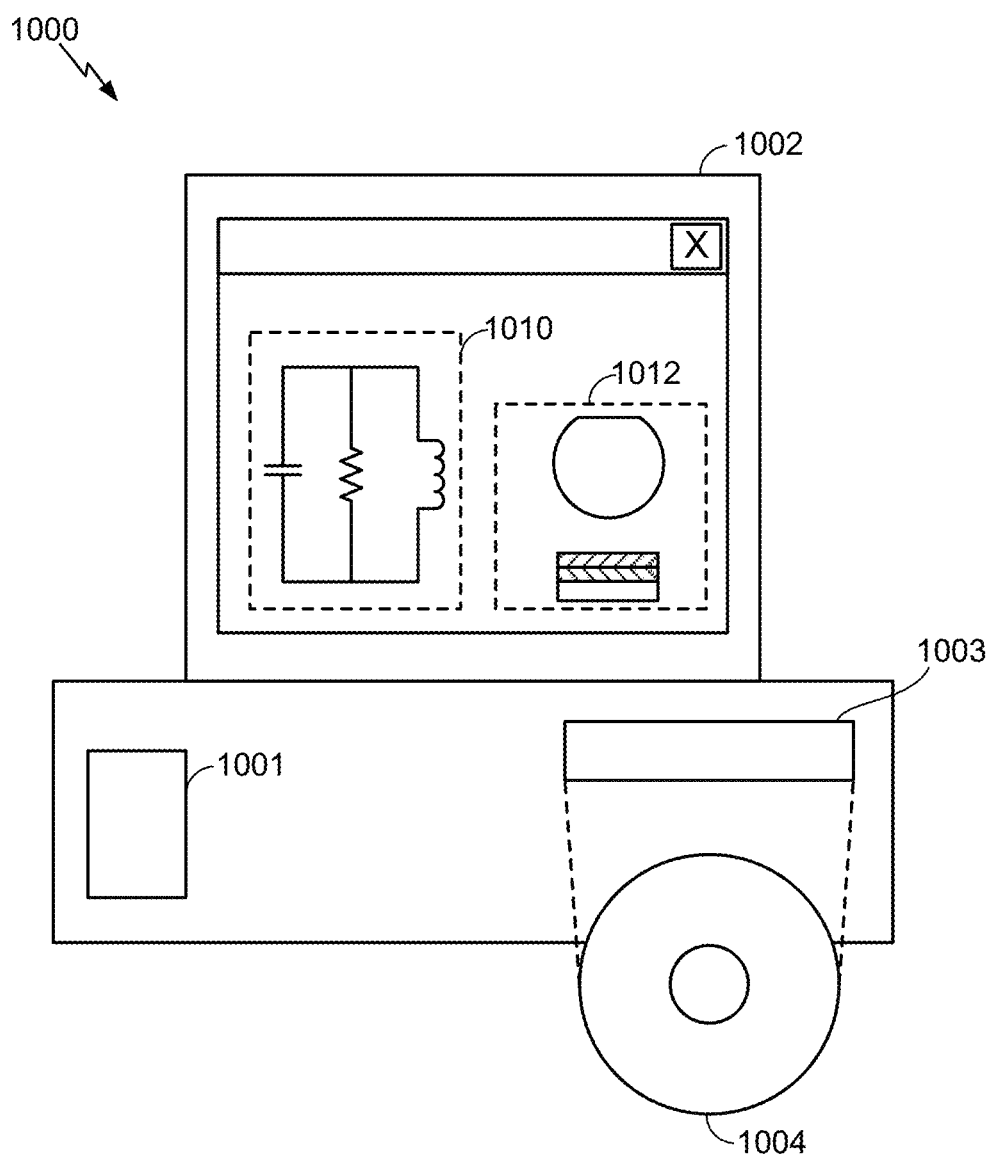
FIG. 10 is a block diagram illustrating a design workstation used for circuit, layout, and logic design of a semiconductor component according to one configuration.

FIG. 10 is a block diagram illustrating a design workstation used for circuit, layout, and logic design of a semiconductor component, such as the stacked inductor disclosed above. A design workstation 1000 includes a hard disk 1001 containing operating system software, support files, and design software such as Cadence or OrCAD. The design workstation 1000 also includes a display 1002 to facilitate design of a circuit 1010 or a radio frequency (RF) component 1012 such as a stacked inductor. A storage medium 1004 is provided for tangibly storing the design of the circuit 1010 or the RF component 1012 (e.g., the stacked inductor having discrete metal-stack patterns). The design of the circuit 1010 or the RF component 1012 may be stored on the storage medium 1004 in a file format such as GDSII or GERBER. The storage medium 1004 may be a compact disc read-only memory (CD-ROM), digital versatile disc (DVD), hard disk, flash memory, or other appropriate device. Furthermore, the design workstation 1000 includes a drive apparatus 1003 for accepting input from or writing output to the storage medium 1004.

Implementation examples are described in the following numbered clauses:

1. An inductor, comprising:
  a first metallization layer multi-turn trace;
  a second metallization layer multi-turn trace coupled to the first metallization layer multi-turn trace through at least one first via; and
  a plurality of discrete third metallization layer trace segments coupled to the second metallization layer multi-turn trace through a plurality of second vias.

2. The inductor of clause 1, in which the plurality of discrete third metallization layer trace segments follow a shape of the second metallization layer multi-turn trace according to a predetermined pattern.

3. The inductor of any of clauses 1-2, in which the first metallization layer multi-turn trace comprises a line-trace segment coupled to an angled joint trace segment and/or an angled trace segment.

4. The inductor of any of clauses 1-3, in which a thickness of a first one of the plurality of discrete third metallization layer trace segments is different from a thickness of a second one of the plurality of discrete third metallization layer trace segments.

5. The inductor of any of clauses 1-4, in which the plurality of discrete third metallization layer trace segments comprise a line-trace segment, an angled joint trace segment, or an angled trace segment.

6. The inductor of any of clauses 1-5, in which the inductor is integrated into an integrated passive device (IPD).

7. The inductor of clause 6, in which the IPD is integrated in a radio frequency (RF) filter.

8. The inductor of clause 6, in which the IPD is integrated in a radio frequency (RF) module.

9. A method for fabricating a stacked inductor having discrete metal-stack patterns, comprising:
  forming a first metallization layer multi-turn trace;
  forming a second metallization layer multi-turn trace coupled to the first metallization layer multi-turn trace through at least one first via; and
  forming a plurality of discrete third metallization layer trace segments coupled to the second metallization layer multi-turn trace through a plurality of second vias.

10. The method of clause 9, in which forming the plurality of discrete third metallization layer trace segments comprises depositing the plurality of discrete third metallization layer trace segments following a shape of the second metallization layer multi-turn trace according to a predetermined pattern.

11. The method of any of clauses 9-10, in which forming the first metallization layer multi-turn trace comprises forming line-trace segments coupled to angled joint trace segments and/or angled trace segments.

12. The method of any of clauses 9-11, in which forming the plurality of discrete third metallization layer trace segments comprises forming line-trace segments, angled trace segments, or angled joint trace segments.

13. The method of any of clauses 9-12, further comprising integrating the stacked inductor into an integrated passive device (IPD).

14. The method of any of clause 13, further comprising integrating the IPD in a radio frequency (RF) filter.

15. The method of any of clauses 13, further comprising integrating the IPD in a radio frequency (RF) module.

16. A radio frequency front-end (RFFE) module comprising:
  a semiconductor die; and
  an integrated passive device (IPD) die coupled to the semiconductor die and comprising an inductor, the inductor comprising:
    a first metallization layer multi-turn trace,
    a second metallization layer multi-turn trace coupled to the first metallization layer multi-turn trace through at least one first via, and a plurality of discrete third metallization layer trace segments coupled to the second metallization layer multi-turn trace through a plurality of second vias.

17. The RFFE module of clause 16, in which the plurality of discrete third metallization layer trace segments follow a shape of the second metallization layer multi-turn trace according to a predetermined pattern.

18. The RFFE module of any of clauses 16-17, in which the first metallization layer multi-turn trace comprises a line-trace segment coupled to an angled joint trace segment and/or an angled trace segment.

19. The RFFE module of any of clauses 16-18, in which a thickness of a first one of the plurality of discrete third metallization layer trace segments is different from a thickness of a second one of the plurality of discrete third metallization layer trace segments.

20. The RFFE module of any of clauses 16-19, in which the plurality of discrete third metallization layer trace segments comprise a line-trace segment, an angled joint trace segment, or an angled trace segment.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the radio frequency (RF) component 1012 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function, or achieve substantially the same result as the corresponding configurations described herein, may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in random access memory (RAM), flash memory, read-only memory (ROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

The previous description of the present disclosure is provided to enable any person skilled in the art to make or use the disclosure. Various modifications to the present disclosure will be readily apparent to those skilled in the art, and the generic principles defined herein may be applied to other variations without departing from the spirit or scope of the disclosure. Thus, the present disclosure is not intended to be limited to the examples and designs described herein but is to be accorded the widest scope consistent with the principles and novel features disclosed herein.

What is claimed is:

1. An inductor, comprising:
   a first metallization layer multi-turn trace;
   a second metallization layer multi-turn trace coupled to the first metallization layer multi-turn trace through at least one first via; and
   a plurality of discontinuous discrete third metallization layer trace segments, each segment coupled to and stacked on a portion of the second metallization layer multi-turn trace through a plurality of second vias.

2. The inductor of claim 1, in which the plurality of discontinuous discrete third metallization layer trace segments follow a shape of the second metallization layer multi-turn trace according to a predetermined pattern.

3. The inductor of claim 1, in which the first metallization layer multi-turn trace comprises a line-trace segment coupled to an angled joint trace segment and/or an angled trace segment.

4. The inductor of claim 1, in which a thickness of a first one of the plurality of discontinuous discrete third metallization layer trace segments is different from a thickness of a second one of the plurality of discontinuous discrete third metallization layer trace segments.

5. The inductor of claim 1, in which the plurality of discontinuous discrete third metallization layer trace segments comprise a line-trace segment, an angled joint trace segment, or an angled trace segment.

6. The inductor of claim 1, in which the inductor is integrated into an integrated passive device (IPD).

7. The inductor of claim 6, in which the IPD is integrated in a radio frequency (RF) filter.

8. The inductor of claim 6, in which the IPD is integrated in a radio frequency (RF) module.

9. A method for fabricating a stacked inductor having discrete metal-stack patterns, comprising:
   forming a first metallization layer multi-turn trace;
   forming a second metallization layer multi-turn trace coupled to the first metallization layer multi-turn trace through at least one first via; and
   forming a plurality of discontinuous discrete third metallization layer trace segments coupled to the second metallization layer multi-turn trace through a plurality of second vias.

10. The method of claim 9, in which forming the plurality of discontinuous discrete third metallization layer trace segments comprises depositing the plurality of discontinuous discrete third metallization layer trace segments following a shape of the second metallization layer multi-turn trace according to a predetermined pattern.

11. The method of claim 9, in which forming the first metallization layer multi-turn trace comprises forming line-trace segments coupled to angled joint trace segments and/or angled trace segments.

12. The method of claim 9, in which forming the plurality of discontinuous discrete third metallization layer trace segments comprises forming line-trace segments, angled trace segments or angled joint trace segments.

13. The method of claim 9, further comprising integrating the stacked inductor into an integrated passive device (IPD).

14. The method of claim 13, further comprising integrating the IPD in a radio frequency (RF) filter.

15. The method of claim 13, further comprising integrating the IPD in a radio frequency (RF) module.

16. A radio frequency front-end (RFFE) module comprising:
   a semiconductor die; and
   an integrated passive device (IPD) die coupled to the semiconductor die, the IPD die comprising an inductor, the inductor comprising:
   a first metallization layer multi-turn trace,
   a second metallization layer multi-turn trace coupled to the first metallization layer multi-turn trace through at least one first via, and
   a plurality of discontinuous discrete third metallization layer trace segments, each segment coupled to and stacked on a portion of the second metallization layer multi-turn trace through a plurality of second vias.

17. The RFFE module of claim 16, in which the plurality of discontinuous discrete third metallization layer trace segments follow a shape of the second metallization layer multi-turn trace according to a predetermined pattern.

18. The RFFE module of claim 16, in which the first metallization layer multi-turn trace comprises a line-trace segment coupled to an angled joint trace segment and/or an angled trace segment.

19. The RFFE module of claim 16, in which a thickness of a first one of the plurality of discontinuous discrete third metallization layer trace segments is different from a thickness of a second one of the plurality of discontinuous discrete third metallization layer trace segments.

20. The RFFE module of claim 16, in which the plurality of discontinuous discrete third metallization layer trace segments comprise a line-trace segment, an angled joint trace segment, or an angled trace segment.

* * * * *